(12) United States Patent
Li et al.

(10) Patent No.: US 10,209,802 B2
(45) Date of Patent: Feb. 19, 2019

(54) MICRO LIGHT-EMITTING DIODE DISPLAY PANEL AND DISPLAY DEVICE

(71) Applicant: Shanghai Tianma Micro-Electronics Co., Ltd., Shanghai (CN)

(72) Inventors: Hong Li, Shanghai (CN); Conghua Ma, Shanghai (CN)

(73) Assignee: SHANGHAI TIANMA MICRO-ELECTRONICS CO., LTD. (CN)

( * ) Notice: Subject to any disclaimer, the term of this patent is extended or adjusted under 35 U.S.C. 154(b) by 0 days.

(21) Appl. No.: 15/701,843

(22) Filed: Sep. 12, 2017

(65) Prior Publication Data

US 2018/0373366 A1    Dec. 27, 2018

(30) Foreign Application Priority Data

Jun. 27, 2017  (CN) .......................... 2017 1 0499997

(51) Int. Cl.
*G06F 3/041* (2006.01)
*H01L 25/13* (2006.01)
(Continued)

(52) U.S. Cl.
CPC ............ *G06F 3/0412* (2013.01); *G06F 3/044* (2013.01); *H01L 25/13* (2013.01); *H01L 33/38* (2013.01);
(Continued)

(58) Field of Classification Search
CPC ................. G06F 3/0412; G06F 3/044; G06F 2203/04111; H01L 25/13; H01L 25/167;
(Continued)

(56) References Cited

U.S. PATENT DOCUMENTS 8,324,639 B2 * 12/2012 Fudeta ................ H01L 33/0079
257/93
8,426,884 B2 * 4/2013 Mizutani ............... H01L 27/153
257/100
(Continued)

FOREIGN PATENT DOCUMENTS

CN         102655197 A      9/2012

*Primary Examiner* — Tom V Sheng
(74) *Attorney, Agent, or Firm* — Tarolli, Sundheim, Covell & Tummino LLP

(57) ABSTRACT

A Micro-LED display panel and a display device, the Micro-LED display panel includes a plurality of light-emitting elements distributed in matrix; each light-emitting element includes a first electrode, a semi-conductor layer, and a second electrode arranged by stacking, the semi-conductor layer is placed between the first and second electrode; the semi-conductor layer includes a first semi-conductor layer, an active layer and a second semi-conductor layer successively stacked up; each light-emitting element further includes a metal layer arranged at a side of the semi-conductor layer, surrounding the semi-conductor layer and insulated from the first and second electrode, respectively; the light-emitting elements are divided into a plurality of light-emitting element groups, each of which includes multiple of the plurality of light-emitting elements; and the metal layers of the multiple of the plurality of light-emitting elements in each light-emitting element group are connected with each other to form one touch electrode.

14 Claims, 7 Drawing Sheets

(51) Int. Cl.
*H01L 33/62* (2010.01)
*G06F 3/044* (2006.01)
*H01L 33/38* (2010.01)

(52) U.S. Cl.
CPC .... *H01L 33/62* (2013.01); *G06F 2203/04111* (2013.01)

(58) Field of Classification Search
CPC ....... H01L 25/156; H01L 33/38; H01L 33/62; G09G 3/32; G09G 3/3208; G09G 3/3216; G09G 3/3225
See application file for complete search history.

(56) References Cited

U.S. PATENT DOCUMENTS

| | | | |
|---|---|---|---|
| 9,761,760 B2 * | 9/2017 | Tanaka | H01L 33/38 |
| 2013/0328092 A1 * | 12/2013 | Hwang | H01L 33/145 |
| | | | 257/98 |
| 2014/0138722 A1 * | 5/2014 | Yamada | H01L 33/36 |
| | | | 257/98 |
| 2014/0284647 A1 * | 9/2014 | Gotoda | H01L 33/20 |
| | | | 257/98 |
| 2016/0372606 A1 * | 12/2016 | Ito | H01L 29/78693 |
| 2018/0040665 A1 * | 2/2018 | Ohmae | H01L 29/41 |
| 2018/0062047 A1 * | 3/2018 | Biwa | H01L 33/00 |

\* cited by examiner

MICRO LIGHT-EMITTING DIODE DISPLAY PANEL AND DISPLAY DEVICE

CROSS-REFERENCE TO RELATED APPLICATIONS

The present application claims priority to Chinese Patent Application No. 201710499997.3, filed on Jun. 27, 2017, the content of which is incorporated herein by reference in its entirety.

TECHNICAL FIELD

The present disclosure relates to the field of display techniques and, particularly, relates to a micro light-emitting diode display panel and a display device.

BACKGROUND

A micro light-emitting diode (Micro Light-Emitting Diode, Micro-LED) technology refers to the technology of arraying super-integrated micro-size light-emitting diodes on a substrate, the size of each Micro-LED is only approximately 1-10 µm, a Micro-LED display panel having a high resolution can be achieved by this technology, and the Micro-LED has the advantages of high luminous efficiency, low energy consumption, high resolution and the like.

In the current Micro-LED display panel, in order to achieve a touch function, a touch electrode needs to be provided separately, the separately provided touch electrode occupies large space, which is not beneficial to a design of a lighter and thinner display panel.

SUMMARY

In view of the above, embodiments of the present disclosure provide a micro light-emitting diode display panel and a display device, by a metal layer being also used as a touch electrode, space utilization of the display panel is improved, which is beneficial to the design of a lighter and thinner display panel.

In a first aspect, the present disclosure provides a Micro-LED display panel, including: a plurality of light-emitting elements distributed in a matrix; wherein each light-emitting element comprises a first electrode, a semi-conductor layer, and a second electrode, the first electrode, the semi-conductor layer, and the second electrode are stacked up, and the semi-conductor layer is placed between the first electrode and the second electrode; the semi-conductor layer comprises a first semi-conductor layer, an active layer and a second semi-conductor layer, the first semi-conductor layer, the active layer and the second semi-conductor layer are successively stacked up along a direction from the first electrode to the second electrode; each light-emitting element further comprises a metal layer, the metal layer is arranged at a side of the semi-conductor layer and surrounds the semi-conductor layer, and the metal layer is insulated from the first electrode and the second electrode, respectively; the plurality of light-emitting elements is divided into a plurality of light-emitting element groups, and each light-emitting element group comprises multiple of the plurality of light-emitting elements; and the metal layers of the multiple of the plurality of light-emitting elements in each light-emitting element group are connected with each other to form one touch electrode.

In a second aspect, the present disclosure provides a display device, including the Micro-LED display panel as described above.

In the Micro-LED display panel and the display device provided by the embodiments of the present disclosure, on the one hand, the metal layer is provided at the side of the semi-conductor layer of each light-emitting element to surround the semi-conductor layer, so as to reduce light emitted from the side of the light-emitting element, thereby reducing crosstalk among different light-emitting elements; on the other hand, metal layers corresponding to multiple light-emitting elements are connected with each other to form the touch electrode, so as to achieve a touch function. In this way, since the metal layer is also used as the touch electrode, it is not necessary to provide a separate touch electrode, space utilization of the display panel is improved, which is beneficial to the design of a lighter and thinner display panel.

BRIEF DESCRIPTION OF DRAWINGS

In order to more clearly illustrate technical solutions in embodiments of the present disclosure, the accompanying drawings necessary for the embodiments are briefly introduced as follows. Obviously, the drawings described as follows are merely part of the embodiments of the present disclosure, other drawings can also be acquired by those skilled in the art without paying creative efforts.

DESCRIPTION OF EMBODIMENTS

The present disclosure will be further illustrated with reference to the accompanying drawings and embodiments.

It should be understood that, the described embodiments are merely exemplary embodiments of the present disclosure, which shall not limit the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless clearly noted in the context, the "a", "an", "the"

and "said" in singular form used in the embodiments and claims of the present disclosure are also intended to represent a plural form.

It should be understood that, the expression "and/or" used herein merely refers to an association relation that describes the associated objects, indicating that there may be three relations, for example, A and/or B may indicate that: A exists individually, A and B exist at the same time, and B exists individually. In addition, the character "/" used herein usually indicates an "or" relation between the associated objects.

Figure 1:
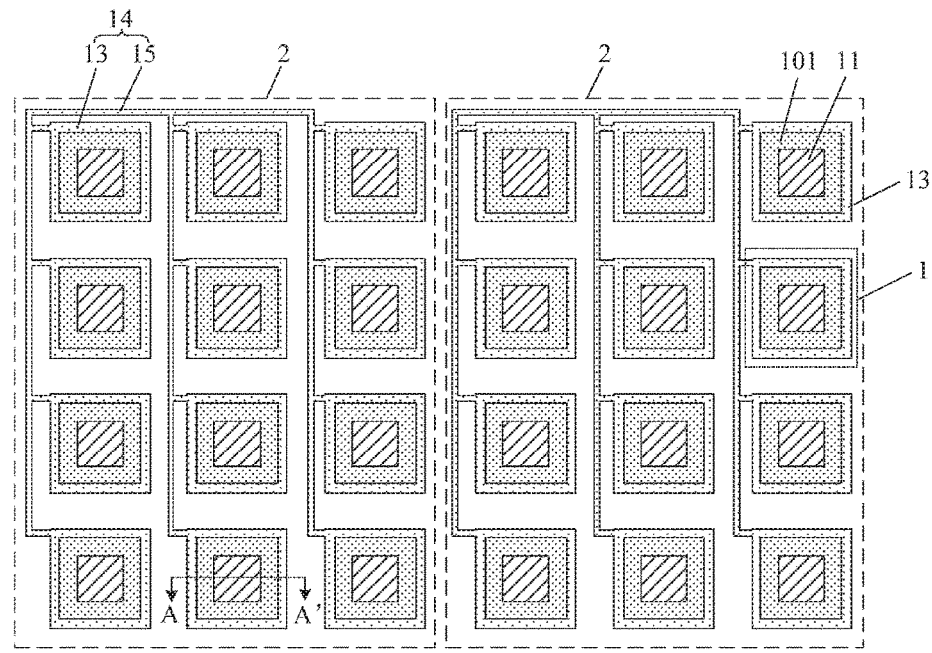
FIG. 1 illustrates a structural schematic diagram of a micro light-emitting diode display panel according to an embodiment of the present disclosure.
Figure 2:
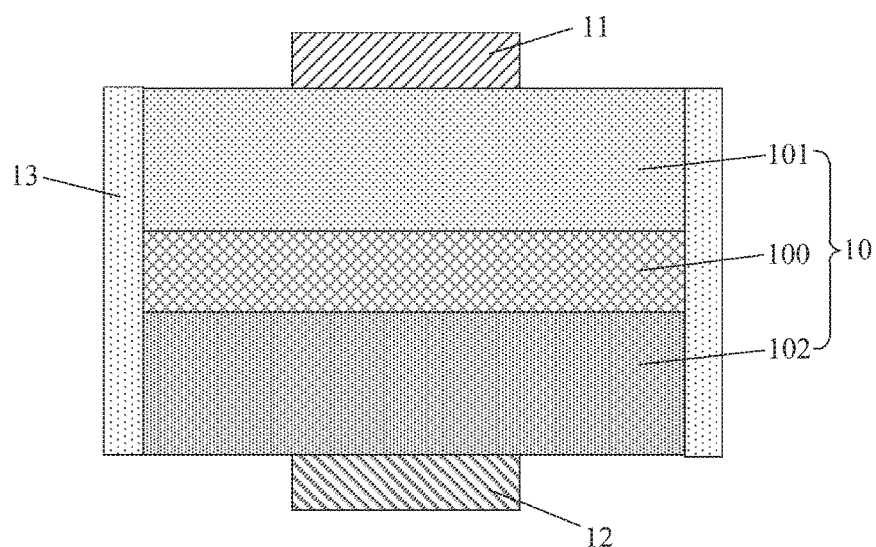
FIG. 2 illustrates a cross-sectional structural schematic diagram along AA' direction of FIG. 1.

As shown in FIGS. 1-2, FIG. 1 illustrates a structural schematic diagram of a micro light-emitting diode display panel according to an embodiment of the present disclosure, FIG. 2 illustrates a cross-sectional structural schematic diagram along AA' direction of FIG. 1, an embodiment of the present disclosure provides a Micro-LED display panel, including: a plurality of light-emitting elements 1 distributed in a matrix, each light-emitting element 1 includes a first electrode 11, a semi-conductor layer 10 and a second electrode 12 arranged by stacking, the semi-conductor layer 10 is arranged between the first electrode 11 and the second electrode 12; the semi-conductor layer 10 includes a first semi-conductor layer 101, an active layer 100 and a second semi-conductor layer 102 arranged successively by stacking along a direction from the first electrode 11 to the second electrode 12; each light-emitting element 1 further includes a metal layer 13, the metal layer 13 covers a side of the semi-conductor layer 10, and the metal layer 13 is insulated from both the first electrode 11 and the second electrode 12; the plurality of light-emitting elements 1 is divided into a plurality of light-emitting element groups 2, each light-emitting element group 2 includes multiple light-emitting elements 1; metal layers 13 of the multiple light-emitting elements 1 in each light-emitting element group 2 are connected with each other to form a touch electrode 14.

The light-emitting element 1 is the Micro-LED, and the size of each light-emitting element 1 is approximately 1-10 μm, the metal layer 13 provided at the side of the semi-conductor layer 10 can reduce light emitted from the side of the Micro-LED by a shading effect of a metal, thereby reducing crosstalk among different Micro-LEDs. In an exemplary embodiment of the present disclosure, the multiple metal layers 13 corresponding to a same light-emitting element group 2 are connected with each other to form the touch electrode 14, so that the metal layer 13 can play a role of reducing light emitted from the side of the Micro-LED, and the metal layer 13 can also form the touch electrode 14 for achieving a touch function.

The Micro-LED display panel in the embodiments of the present disclosure, on the one hand, the metal layer is provided at the side of the semi-conductor layer of each light-emitting element to surround the semi-conductor layer, so as to reduce light emitted from the side of the light-emitting element, thereby reducing crosstalk among different light-emitting elements; on the other hand, metal layers corresponding to multiple light-emitting elements are connected with each other to form the touch electrode, so as to achieve a touch function. In this way, since the metal layer is also used as the touch electrode, it is not necessary to provide a separate touch electrode, space utilization of the display panel is improved, which is beneficial to the design of a lighter and thinner display panel.

Optionally, as shown in FIG. 1, each touch electrode 14 further includes an electrode connection line 15. The metal layers 13 of the multiple light-emitting elements 1 in each light-emitting element group 2 are connected with each other by the electrode connection line 15 to form the touch electrode 14.

Optionally, as shown in FIG. 1, in each light-emitting element group 2, the metal layers 13 of any two adjacent light-emitting elements 1 are connected with each other by the electrode connection line 15.

In each light-emitting element group 2, it is possible that the light metal layers 13 of only a part of the multiple light-emitting elements 1 are connected with each other by the electrode connection line 15 to form the touch electrode 14, or as shown in FIG. 1, it is also possible that the metal layers 13 of any two adjacent light-emitting elements 1 in each light-emitting element group 2 are connected with each other by the electrode connection line 15, i.e., the metal layers 13 of all light-emitting elements 1 in each light-emitting element group 2 are connected with each other to form the touch electrode 14. The greater the number and the density of the metal layers 13 forming the touch electrode 14 are, the larger the effective area for achieving the touch function is, and the more beneficial it is for achieving the touch function.

Figure 3:
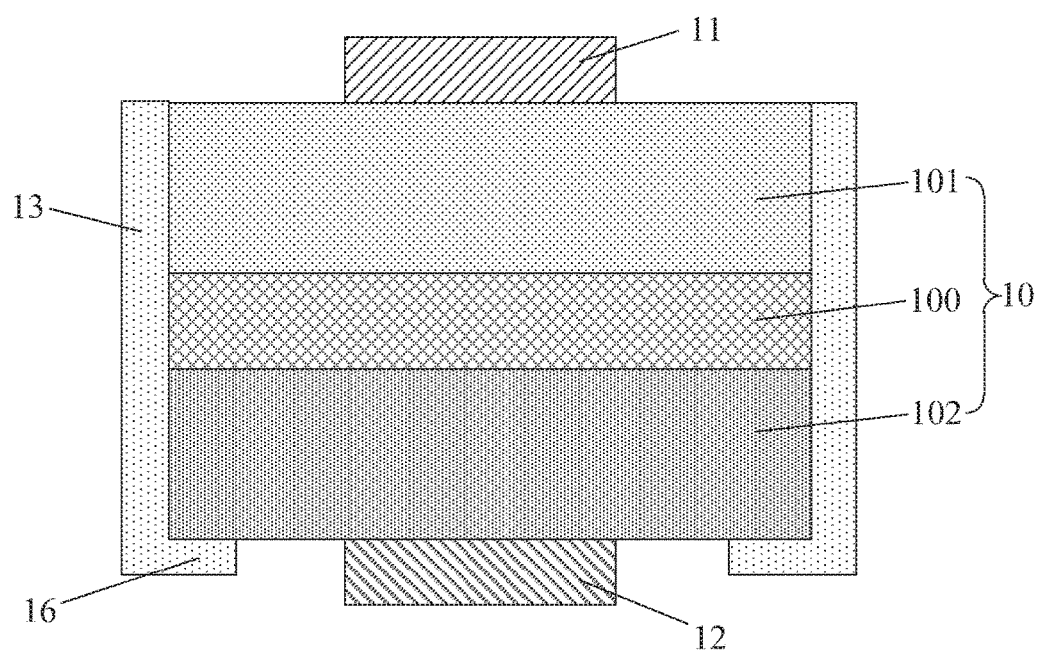
FIG. 3 illustrates another cross-sectional structural schematic diagram along AA' direction of FIG. 1.
Figure 4:
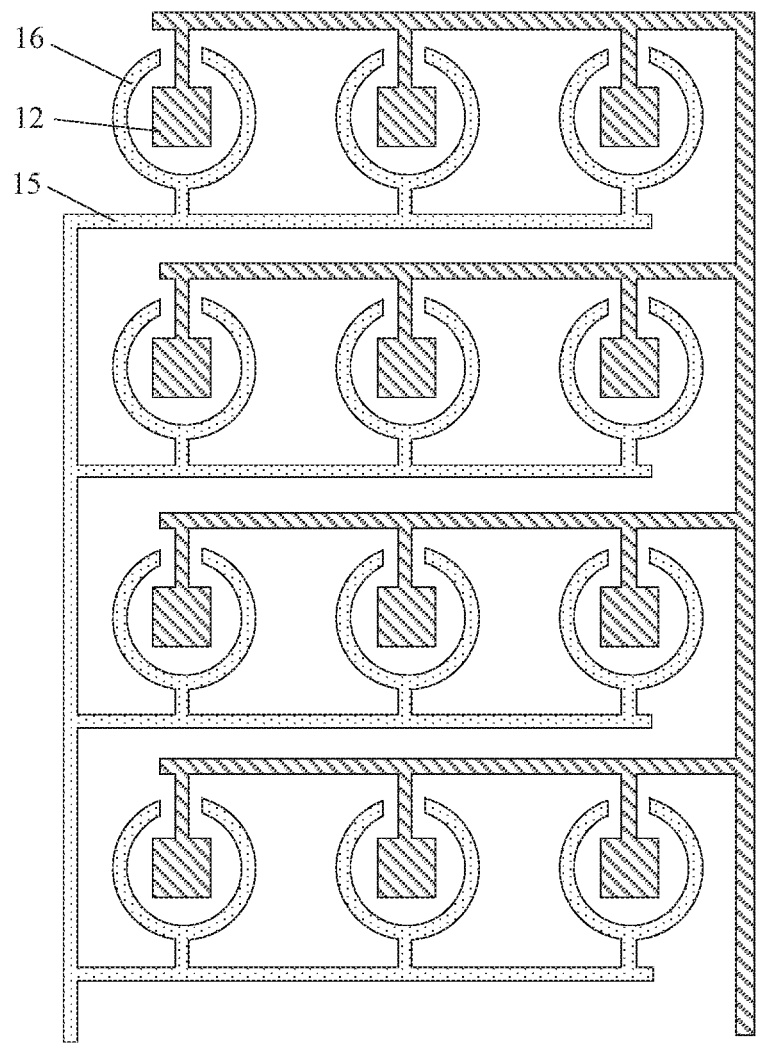
FIG. 4 illustrates a structural schematic diagram of a layer where an electrode connection portion is located according to an embodiment of the present disclosure.

Optionally, as shown in FIGS. 3-4, FIG. 3 illustrates another cross-sectional structural schematic diagram along AA' direction of FIG. 1, FIG. 4 illustrates a structural schematic diagram of a layer where an electrode connection portion is located according to an embodiment of the present disclosure. The above-described Micro-LED display panel further includes an electrode connection portion 16 corresponding to each light-emitting element. In each touch electrode, the electrode connection line 15 is connected with each metal layer 13 by the electrode connection portion 16, the electrode connecting portion 16 and the second electrode 12 are located at a same layer, and the electrode connecting portion 16 is insulated from the second electrode 12.

Since the metal layer 13 is provided at the side of the semi-conductor layer 10 of the light-emitting element, the electrode connection portion 16 and the second electrode 12 can be arranged at the same layer so as to facilitate electrical connection between the electrode connection line 15 and the metal layer 13. In addition, since the second electrode 12 occupies smaller space, so that wiring of the electrode connection line 15 is facilitated. It should be noted that, functions and effects of the first electrode 11 and the second electrode 12 are not limited in the embodiments of the present disclosure, for example, it is possible that the first electrode 11 is an electrode at an anode side of the Micro-LED, and the second electrode 12 is an electrode at a cathode side of the Micro-LED; or it is also possible that the first electrode 11 is an electrode at the cathode side of the Micro-LED, and the second electrode 12 is an electrode at the anode side of the Micro-LED. Light-emitting direction of the light-emitting element is also not limited in the embodiments of the present disclosure, for example, it is possible that the light-emitting direction is along a direction from the first electrode 11 to the second electrode 12, or it is also possible that the light-emitting direction is along a direction from the second electrode 12 to the first electrode 11.

Optionally, as shown in FIGS. 3-4, each electrode connection portion 16 is structured as a semi-ring shape having an opening.

By setting the electrode connection portion 16 and the second electrode 12 to be at the same layer and insulated from each other, and meanwhile by setting the shape of the electrode connection portion 16 to be similar to the shape of a cross-section of an end of the metal layer 13 close to the second electrode 12, so that a contact area between the electrode connection portion 16 and the semi-ring shaped metal layer 13 can be as large as possible, so as to achieve a better connection effect. Meanwhile, the electrode connection portion 16 has the opening, so that a lead wire of the second electrode 12 can be led out from the opening. It should be understood that, in other embodiments, in order to achieve a better connection effect between the electrode connection line and the metal layer, it is also possible that the electrode connection portion is structured as a closed ring shape, so that the contact area between the electrode connection portion and the ring shaped metal layer can be larger. At this time, the second electrode can be connected with lead wires of another layer via a through hole so as to lead out the lead wire of the second electrode. It should be noted that, in FIG. 4 it merely shows a case in which the second electrode 12 is an electrode at the cathode side, at this time, second electrodes 12 of all light-emitting elements are connected with a same potential, thus all second electrodes 12 shown in FIG. 3 are connected together via a lead wire. If the second electrode is an electrode at the anode side, then each second electrode requires a separate potential, at this time, different second electrodes need to be separately led out via a lead wire.

Optionally, as shown in FIGS. 3-4, in each light-emitting element, an orthogonal projection of the active layer 100 on a plane where the electrode connection portion 16 is located overlaps with the electrode connection portion 16.

In order to allow the electrode connection line 15 to be in good contact with the metal layer 13, the electrode connection portion 16 is provided to overlap with the active layer 100 of the light-emitting element.

Optionally, the electrode connection portion 16 is made of a transparent conductive material.

As shown in FIGS. 3-4, in order to allow the electrode connection line 15 to be in good contact with the metal layer 13, the electrode connection portion 16 may overlap with the active layer 100 of the light-emitting element, i.e., light is emitted from the active layer 100 of the light-emitting element to the electrode connection portion 16, at this time, if the light-emitting direction is along the direction from the first electrode 11 to the second electrode 12, then the electrode connection portion 16 can be made of a transparent conductive material, so that when the light is emitted from the active layer 100 of the light-emitting element to the electrode connection portion 16, the light can directly pass through the electrode connection portion 16 to be emitted out, and thus the electrode connection portion 16 does not influence the light-emitting efficiency of the Micro-LED.

Optionally, the electrode connection portion 16 is made of a metallic material.

As shown in FIGS. 3-4, if the light-emitting direction is along the direction from the second electrode 12 to the first electrode 11, then the electrode connection portion 16 can be made of a metallic material, so that when the light is emitted from the active layer 100 of the light-emitting element to the electrode connection portion 16, the light can be reflected at the electrode connection portion 16 and then be emitted along the direction from the second electrode 12 to the first electrode 11, and thus the light-emitting efficiency of the light-emitting element can be improved.

Figure 5:
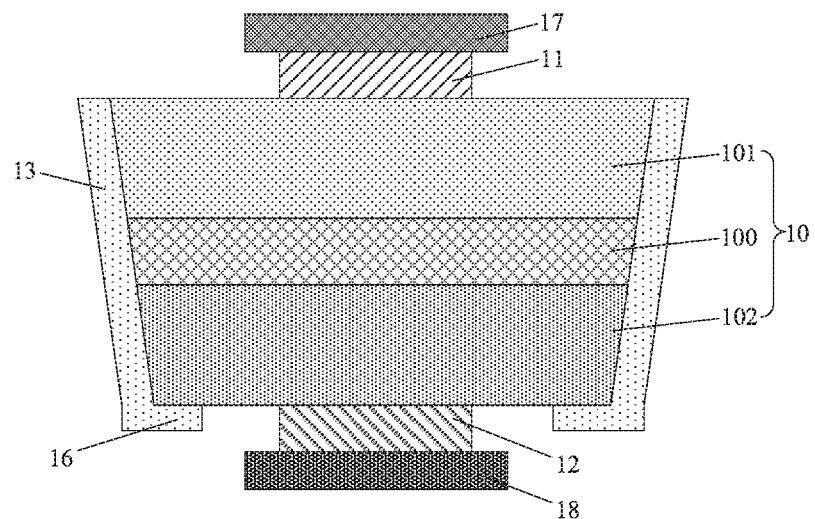
FIG. 5 illustrates still another cross-sectional structural schematic diagram along AA' direction of FIG. 1.

Optionally, as shown in FIG. 5, which illustrates still another cross-sectional structural schematic diagram along AA' direction of FIG. 1. In each light-emitting element, an area surrounded by the metal layer 13 gradually decreases in the direction from the first electrode 11 to the second electrode 12.

If the light-emitting direction is along the direction from the second electrode 12 to the first electrode 11, the area surrounded by the metal layer 13 gradually increases along this direction, at this point, when light in the light-emitting element is emitted to metal layer 13, the light tends to be emitted towards the light-emitting direction, thereby further improving the light-emitting efficiency.

Optionally, the metal layer 13 can be made of a metallic material selected from a group consisting of titanium, aluminum, copper, gold, nickel and alloys thereof.

Metal or alloy made of titanium, aluminum, copper, gold and nickel has a high reflection property, so that the light emitted to the metal layer 13 can be reflected more and finally emitted along a desired light-emitting direction of light-emitting element, thereby further improving the light-emitting efficiency.

Figure 6:
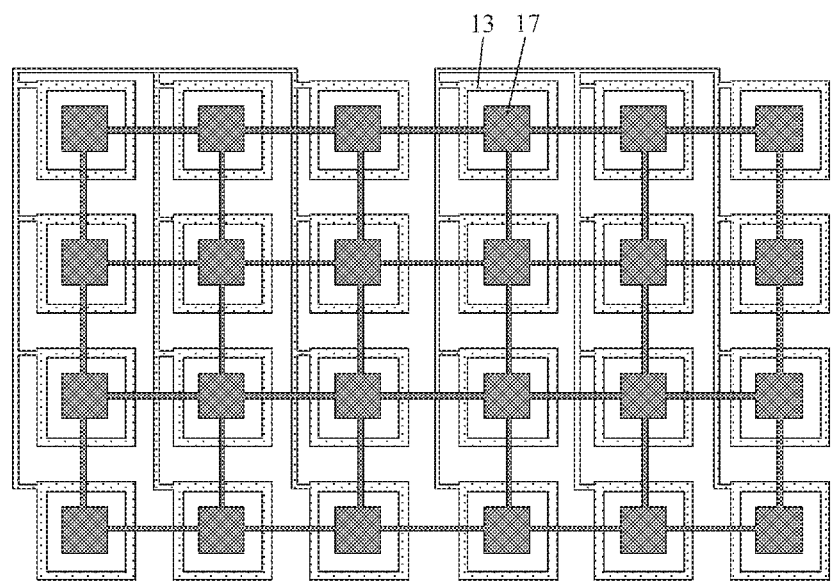
FIG. 6 illustrates a structural schematic diagram of a cathode layer according to an embodiment of the present disclosure.

Optionally, as shown in FIGS. 5-6, FIG. 6 illustrates a structural schematic diagram of a cathode layer according to an embodiment of the present disclosure. The above-described Micro-LED display panel further includes a cathode layer 17 located at a side of the first electrode 11 away from the second electrode 12, and the cathode layer 17 includes a hollow area. An orthogonal projection of the hollow area on a plane where the second electrode 12 is located overlaps with an orthogonal projection of the metal layer 13 on the plane where the second electrode 12 is located.

In the prior art, the display panel is provided with a whole surface of cathode layer located at the side of the first electrode away from the second electrode, and the cathode layer is connected with the first electrode of each light-emitting element so as to provide the light-emitting element with a same cathode potential. However, in the embodiments of the present disclosure, since the metal layer 13 at a side of the first electrode 11 close to the second electrode 12 forms the touch electrode, the whole surface cathode layer will have a shielding effect on a touch operation, which will adversely affect the touch function. Therefore, in order to reduce the adverse effect of the cathode layer on the touch function, the cathode layer 17 is provided with the hollow structure, so that more metal layers 13 are exposed from the cathode layer 17 to reduce the shielding effect of the cathode layer 17 on the touch function, thereby reducing the adverse effect of the cathode layer on the touch function due to the shielding effect, meanwhile, the cathode layer 17 can be connected with the first electrode 11 of the light-emitting element. In addition, the display panel is provided with an anode layer 18 at a side of the second electrode 12 away from the first electrode 11, and the anode layer 18 is connected with the second electrode 12 of each light-emitting element so as to provide an anode potential for the light-emitting element.

Figure 7:
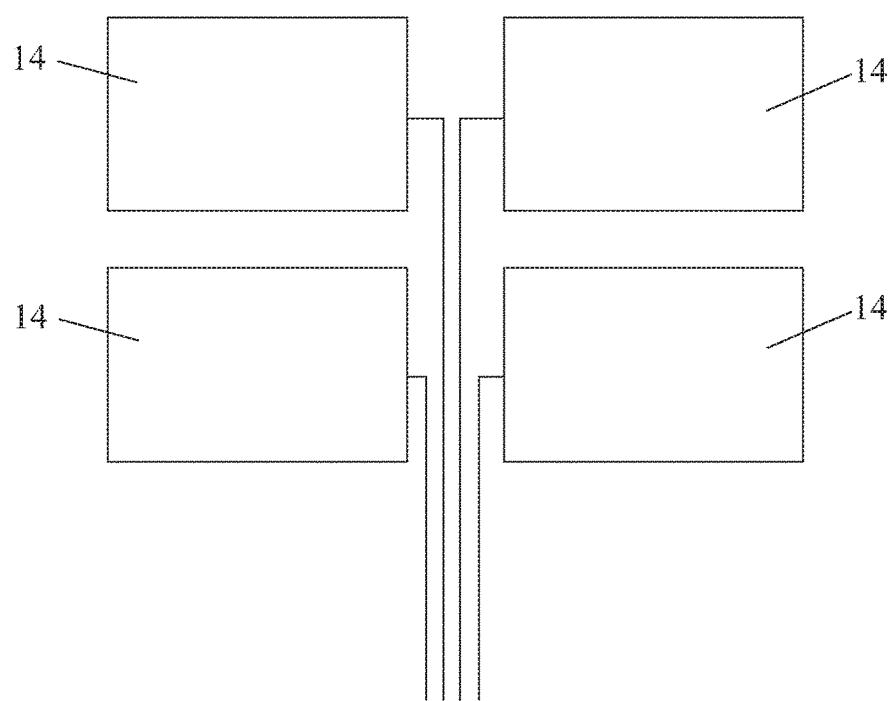
FIG. 7 illustrates a structural schematic diagram of a touch electrode according to an embodiment of the present disclosure.

Optionally, as shown in FIG. 7, which illustrates a structural schematic diagram of a touch electrode according to an embodiment of the present disclosure. The touch electrode 14 includes a plurality of self-capacitance touch electrodes arranged in a matrix, and each self-capacitance touch electrode forms a capacitance with the ground.

Each self-capacitance touch electrode is formed by the metal layers corresponding to multiple light-emitting elements, and each self-capacitance touch electrode achieves input of the touch drive signal and output of the touch detection signal via the signal lines electrically connected with the self-capacitance touch electrode. During implementation of the touch function, a same touch drive signal is input to each self-capacitance touch electrode, when a touch operation happens, a capacitance of a finger will be superimposed on the touched self-capacitance touch electrode, so that a capacitance of the touched self-capacitance touch electrode with respect to the ground changes. Since a change of a signal of the self-capacitance touch electrode reflects the change of the capacitance of the self-capacitance touch electrode with respect to the ground, by detecting the change of the signal of the self-capacitance touch electrode, the self-capacitance touch electrode, of which the signal changes, can be determined. Then based on a coordinate value corresponding to the self-capacitance touch electrode of which the signal changes, a touch position by the finger can be determined.

Figure 8:
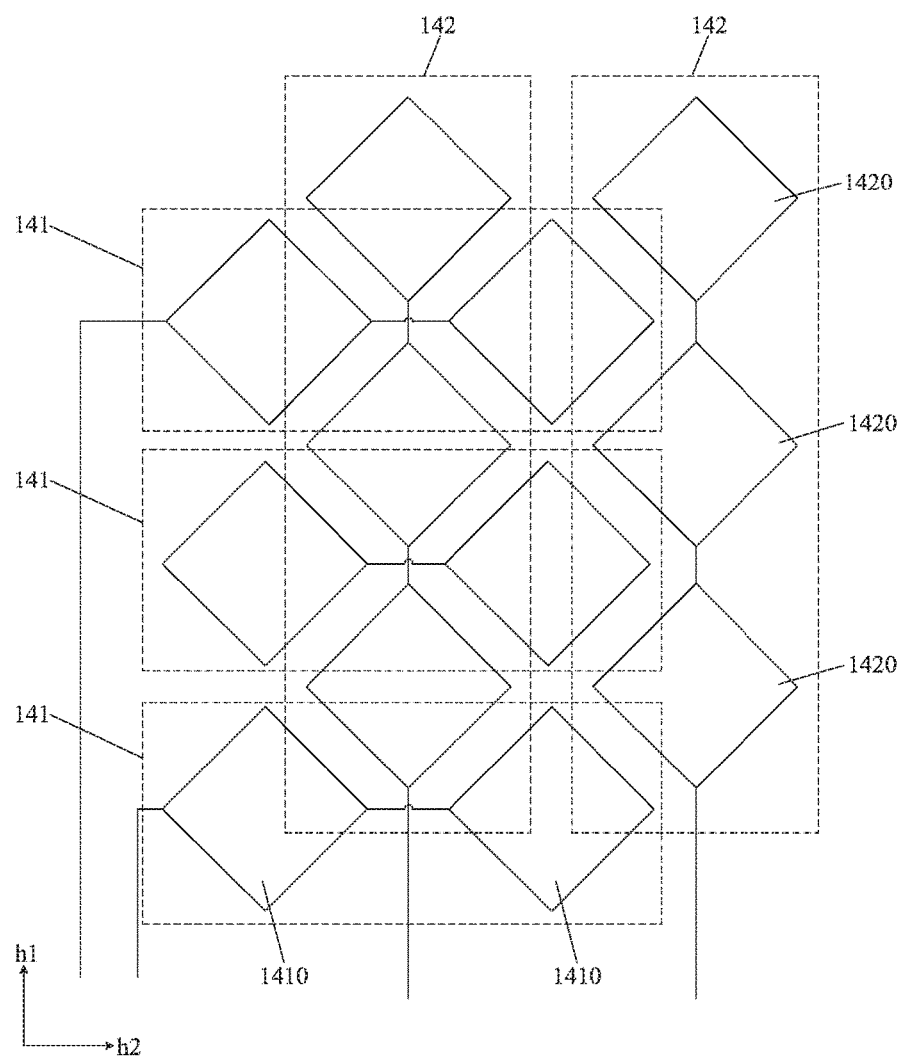
FIG. 8 illustrates a structural schematic diagram of another touch electrode according to an embodiment of the present disclosure.

Optionally, as shown in FIG. 8, which illustrates a structural schematic diagram of another touch electrode according to an embodiment of the present disclosure. The touch electrode 14 includes a plurality of first touch electrodes 141 and a plurality of second touch electrodes 142. The plurality of first touch electrodes 141 is arranged along a first direction h1, each first touch electrode 141 includes a plurality of first touch electrode blocks 1410 arranged along a second direction h2, the plurality of first touch electrode blocks 1410 of each first touch electrode 141 are connected with each other. The plurality of second touch electrodes 142 are arranged along the second direction h2, each second touch electrode 142 includes a plurality of second touch electrode blocks 1420 arranged along the first direction h1, the plurality of second touch electrode blocks 1420 of each second touch electrode 142 are connected with each other. The plurality of first touch electrodes 141 intersects with and is insulated from the plurality of second touch electrodes 142.

The touch electrode shown in FIG. 8 forms a mutual-capacitance touch electrode, each first touch electrode block 1410 and each second touch electrode block 1420 is respectively formed by the metal layers corresponding to multiple light-emitting elements. In an embodiment, the first touch electrode 141 can be a touch drive electrode, and the second touch electrode 142 can be a touch sense electrode, a coupling capacitance is formed between the first touch electrode 141 and the second touch electrode 142, when a touch operation happens, the coupling capacitance between first touch electrode 141 and the second touch electrode 142 will change, and the touch position can be achieved by detecting the change of the coupling capacitance. In FIG. 7, both the first touch electrode block 1410 and the second touch electrode block 1420 are structured as a rhombus, a specific shape of the first touch electrode block 1410 and the second touch electrode block 1420 will not be limited in the embodiments of the present disclosure.

Figure 9:
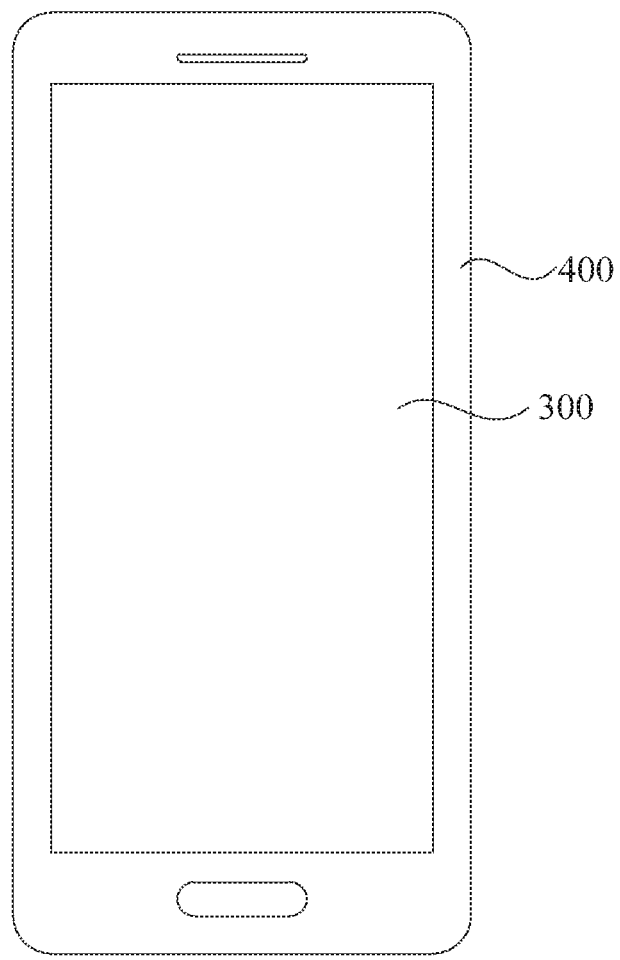
FIG. 9 illustrates a structural schematic diagram of a display device according to an embodiment of the present disclosure.

On the other hand, as shown in FIG. 9, which illustrates a structural schematic diagram of a display device according to an embodiment of the present disclosure, the embodiments of the present disclosure further provide a display device 400 including the above-described Micro-LED display panel 300.

The specific structure and principle of the Micro-LED display panel 300 are the same as those in the above-described embodiments, which will not be further described herein. The display device 400 may be any electronic device having a display function, such as a touch display screen, a cellphone, a tablet computer, a laptop, an e-book or a television.

The display device in the embodiments of the present disclosure, on the one hand, the metal layer is provided at the side of the semi-conductor layer of each light-emitting element to surround the semi-conductor layer, so as to reduce light emitted from the side of the light-emitting element, thereby reducing crosstalk among different light-emitting elements; on the other hand, metal layers corresponding to multiple light-emitting elements are connected with each other to form the touch electrode, so as to achieve a touch function. In this way, by the metal layer being also used as the touch electrode, it is not necessary to provide a separate touch electrode, space utilization of the display panel is improved, which is beneficial to the design of a lighter and thinner display panel.

The above are merely preferred embodiments of the present disclosure, which are not used to limit the present disclosure. All the modifications, equivalent substitutions and improvements made within the spirit and principles of the present disclosure shall fall into the protection scope of the present disclosure.

What is claimed is:

1. A micro light-emitting diode display panel, comprising:
a plurality of light-emitting elements distributed in a matrix;
wherein each light-emitting element comprises a first electrode, a semi-conductor layer, and a second electrode, the first electrode, the semi-conductor layer, and the second electrode are stacked up, and the semi-conductor layer is placed between the first electrode and the second electrode;
the semi-conductor layer comprises a first semi-conductor layer, an active layer and a second semi-conductor layer; the first semi-conductor layer, the active layer and the second semi-conductor layer are successively stacked up along a direction from the first electrode to the second electrode;
each light-emitting element further comprises a metal layer, the metal layer is arranged at a side of the semi-conductor layer and surrounds the semi-conductor layer, and the metal layer is insulated from the first electrode and the second electrode, respectively;
the plurality of light-emitting elements is divided into a plurality of light-emitting element groups, and each light-emitting element group comprises multiple of the plurality of light-emitting elements; and
the metal layers of the multiple of the plurality of light-emitting elements in each light-emitting element group are connected with each other to form one touch electrode.

2. The micro light-emitting diode display panel according to claim 1, wherein,
each touch electrode further comprises an electrode connection line;
the metal layers of the multiple of the plurality of light-emitting elements in each light-emitting element group are connected with each other by the electrode connection line.

3. The micro light-emitting diode display panel according to claim 2, wherein,
in each light-emitting element group, the metal layers of any adjacent two light-emitting elements are connected with each other by the electrode connection line.

4. The micro light-emitting diode display panel according to claim 2, further comprising:
an electrode connection portion corresponding to each of the plurality of light-emitting elements;
wherein in each touch electrode, the electrode connection line is connected with each metal layer by the electrode connection portion;
the electrode connection portion and the second electrode are located in a same layer, and the electrode connection portion is insulated from the second electrode.

5. The micro light-emitting diode display panel according to claim 4, wherein, each electrode connection portion is structured as a semi-ring shape having an opening.

6. The micro light-emitting diode display panel according to claim 4, wherein,
in each of the plurality of light-emitting elements, an orthogonal projection of the active layer on a plane where the electrode connection portion is located overlaps with the electrode connection portion.

7. The micro light-emitting diode display panel according to claim 6, wherein,
the electrode connection portion is made of a transparent conductive material.

8. The micro light-emitting diode display panel according to claim 6, wherein,
the electrode connection portion is made of a metallic material.

9. The micro light-emitting diode display panel according to claim 1, wherein,
in each of the plurality of light-emitting elements, an area surrounded by the metal layer gradually decreases in a direction from the first electrode to the second electrode.

10. The micro light-emitting diode display panel according to claim 1, wherein,
the metal layer is made of a metallic material selected from a group consisting of titanium, aluminum, copper, gold, nickel and alloys thereof.

11. The micro light-emitting diode display panel according to claim 1, further comprising:
a cathode layer located at a side of the first electrode away from the second electrode, the cathode layer comprising a hollow area;
wherein an orthogonal projection of the hollow area on a plane where the second electrode is located overlaps with an orthogonal projection of the metal layer on the plane where the second electrode is located.

12. The micro light-emitting diode display panel according to claim 1, wherein,
the touch electrode comprises a plurality of self-capacitance touch electrodes arranged in a matrix.

13. The micro light-emitting diode display panel according to claim 1, wherein,
the touch electrode comprises a plurality of first touch electrodes and a plurality of second touch electrodes;
the plurality of first touch electrodes is arranged along a first direction, each first touch electrode comprises a plurality of first touch electrode blocks arranged along a second direction, the plurality of first touch electrode blocks of each first touch electrode is connected with each other;
the plurality of second touch electrodes is arranged along the second direction, each second touch electrode comprises a plurality of second touch electrode blocks arranged along the first direction, the plurality of second touch electrode blocks of each second touch electrode is connected with each other, and
the plurality of first touch electrodes intersects with and is insulated from the plurality of second touch electrodes.

14. A display device, comprising a micro light-emitting diode a display panel, wherein the micro light-emitting diode a display panel comprises:
a plurality of light-emitting elements distributed in a matrix;
wherein each light-emitting element comprises a first electrode, a semi-conductor layer, and a second electrode, the first electrode, the semi-conductor layer, and the second electrode are stacked up, and the semi-conductor layer is placed between the first electrode and the second electrode;
the semi-conductor layer comprises a first semi-conductor layer, an active layer and a second semi-conductor layer, the first semi-conductor layer, the active layer and the second semi-conductor layer are successively stacked up along a direction from the first electrode to the second electrode;
each light-emitting element further comprises a metal layer, the metal layer is arranged at a side of the semi-conductor layer and surrounds the semi-conductor layer, and the metal layer is insulated from the first electrode and the second electrode, respectively;
the plurality of light-emitting elements is divided into a plurality of light-emitting element groups, and each light-emitting element group comprises multiple of the plurality of light-emitting elements; and
the metal layers of the multiple of the plurality of light-emitting elements in each light-emitting element group are connected with each other to form one touch electrode.

* * * * *